US012484392B2

(12) United States Patent
Dai et al.

(10) Patent No.: US 12,484,392 B2
(45) Date of Patent: Nov. 25, 2025

(54) DISPLAY SUBSTRATE AND MANUFACTURE METHOD THEREOF, DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Jie Dai, Beijing (CN); Pengfei Yu, Beijing (CN); Lu Bai, Beijing (CN); Xiaofeng Jiang, Beijing (CN); Hao Zhang, Beijing (CN); Siyu Wang, Beijing (CN); Huijuan Yang, Beijing (CN); Xin Zhang, Beijing (CN)

(73) Assignees: CHENGDU BOE OPTOELECTRONICS TECHNOLOGY CO., LTD., Sichuan (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 586 days.

(21) Appl. No.: 17/425,007

(22) PCT Filed: Mar. 12, 2021

(86) PCT No.: PCT/CN2021/080498
§ 371 (c)(1),
(2) Date: Jul. 22, 2021

(87) PCT Pub. No.: WO2021/218447
PCT Pub. Date: Nov. 4, 2021

(65) Prior Publication Data
US 2022/0320236 A1    Oct. 6, 2022

(30) Foreign Application Priority Data
Apr. 30, 2020    (CN) .......................... 202010366290.7

(51) Int. Cl.
*H01L 27/32*    (2006.01)
*H10K 59/131*    (2023.01)
(Continued)

(52) U.S. Cl.
CPC ......... *H10K 59/131* (2023.02); *H10K 59/873* (2023.02); *H10K 59/1201* (2023.02); *H10K 59/122* (2023.02)

(58) Field of Classification Search
CPC .............. H10K 59/131; H10K 59/873; H10K 59/1201; H10K 59/122; H10K 50/844;
(Continued)

(56) References Cited

U.S. PATENT DOCUMENTS 6,897,907 B2 * 5/2005 Morimitsu .......... G02F 1/13458
349/42
9,082,345 B2 * 7/2015 Yamamoto ........... G09G 3/3233
(Continued)

FOREIGN PATENT DOCUMENTS

CN    101136177 A  *  3/2008  ............... G09G 3/20
JP    2006011391 A    1/2006
(Continued)

OTHER PUBLICATIONS

Extended European Search Report dated Aug. 29, 2023 received in European Patent Application No. EP 21755671.1.
(Continued)

*Primary Examiner* — Jay C Kim
(74) *Attorney, Agent, or Firm* — Scully, Scott, Murphy & Presser, P.C.

(57) ABSTRACT

A display substrate and a manufacture method thereof, and a display device are provided. The display substrate includes a display region and a peripheral region, the peripheral region includes a first scan driving circuit and a second scan driving circuit on a first side of the display region, the
(Continued)

peripheral region further includes a binding region on a second side of the display region, the peripheral region includes an organic insulation layer, the organic insulation layer at least partially covers the first scan driving circuit and the second scan driving circuit, and includes a first groove that is in a strip shape and extends substantially along a first direction to expose a portion between the first scan driving circuit and the second scan driving circuit, and the first groove also extends from the first side to the second side and extends substantially along a second direction on the second side.

18 Claims, 6 Drawing Sheets

(51) Int. Cl.
*H10K 59/80* (2023.01)
*H10K 59/12* (2023.01)
*H10K 59/122* (2023.01)

(58) Field of Classification Search
CPC .............. H10K 71/00; G09G 3/3233; G09G 2300/0426; G09G 2300/0842; G09G 2310/0251; G09G 2310/0262; G09G 3/3266; G09G 3/3225
See application file for complete search history.

(56) References Cited

U.S. PATENT DOCUMENTS

| | | | | |
|---|---|---|---|---|
| 9,495,031 | B2 * | 11/2016 | Omoto | H10K 59/131 |
| 10,069,105 | B2 * | 9/2018 | Hong | H10K 50/8426 |
| 10,170,534 | B1 * | 1/2019 | Kim | H01L 27/1248 |
| 10,381,420 | B2 * | 8/2019 | Liu | G06F 3/0445 |
| 10,553,816 | B2 * | 2/2020 | Kamiyama | H10K 50/8426 |
| 11,049,927 | B2 * | 6/2021 | Kim | H10K 59/1213 |
| 11,061,498 | B2 * | 7/2021 | Park | H10K 59/8731 |
| 11,061,505 | B2 * | 7/2021 | Jang | H10K 50/8426 |
| 11,152,436 | B2 * | 10/2021 | Liu | H10K 59/124 |
| 11,222,938 | B2 * | 1/2022 | Kim | H10K 50/844 |
| 11,228,020 | B2 * | 1/2022 | Zhang | H10K 59/873 |
| 11,462,172 | B2 * | 10/2022 | Park | G09G 3/3266 |
| 2002/0101174 | A1 * | 8/2002 | Onozawa | G09G 3/296 |
| | | | | 315/169.3 |
| 2003/0214494 | A1 * | 11/2003 | Morishita | G09G 3/20 |
| | | | | 345/204 |
| 2015/0380685 | A1 * | 12/2015 | Lee | H10K 59/8731 |
| | | | | 257/40 |
| 2017/0365217 | A1 | 12/2017 | An et al. | |
| 2017/0365814 | A1 | 12/2017 | Kim et al. | |
| 2018/0090702 | A1 * | 3/2018 | Um | H10K 71/00 |
| 2019/0148469 | A1 | 5/2019 | Lhee et al. | |
| 2019/0196619 | A1 * | 6/2019 | Baek | G06F 3/04166 |
| 2022/0301484 | A1 * | 9/2022 | In | G09G 3/3233 |

FOREIGN PATENT DOCUMENTS

| | | |
|---|---|---|
| KR | 20190070424 A | 6/2019 |
| WO | 2020024705 A1 | 2/2020 |
| WO | 2020079805 A1 | 4/2020 |

OTHER PUBLICATIONS

Notice of Reasons for Refusal dated Dec. 23, 2024 received in Japanese Patent Application No. 2021-570224.

* cited by examiner

DISPLAY SUBSTRATE AND MANUFACTURE METHOD THEREOF, DISPLAY DEVICE

CROSS-REFERENCE TO RELATED APPLICATIONS

The present application is a national phase entry of PCT International Application No. PCT/CN2021/080498, filed on Mar. 12, 2021, which claims priority to Chinese Patent Application No. 202010366290.7, filed on Apr. 30, 2020. The entire disclosures of PCT International Application No. PCT/CN2021/080498 and Chinese Patent Application No. 202010366290.7 are incorporated herein by reference in its entirety as part of the present application.

TECHNICAL FIELD

The embodiments of the present disclosure relate to a display substrate and a manufacture method thereof, and a display device.

BACKGROUND

An OLED (Organic Light Emitting Diode) display device has a series of advantages, such as self-luminescence, high contrast, high definition, wide viewing angle, low power consumption, fast response speed, and compatibility between its manufacturing process and thin film transistor (TFT) process, and has become one of the key development directions of the new generation of display devices, so that the OLED display device has received more and more attention.

In the OLED display device, structures in a peripheral region outside a display region needs to be designed reasonably, so that the structures in the peripheral region can protect structures in the display region to a certain extent, for example, preventing impurities in the external environment from entering the display region and affecting a display effect of the display region.

SUMMARY

At least one embodiment of the present disclosure discloses a display substrate, the display substrate comprises a display region and a peripheral region at a periphery of the display region, the peripheral region comprises a first scan driving circuit and a second scan driving circuit that are on a first side of the display region, the first scan driving circuit is on a side of the second scan driving circuit close to the display region, the peripheral region further comprises a binding region on a second side, which is adjacent to the first side, of the display region, the peripheral region comprises an organic insulation layer, the organic insulation layer at least partially covers the first scan driving circuit and at least partially covers the second scan driving circuit, and comprises a first groove that is in a strip shape and extends substantially along a first direction to expose a portion between the first scan driving circuit and the second scan driving circuit, and the first groove also extends from the first side to the second side and extends substantially along a second direction on the second side, and the second direction intersects the first direction.

For example, the display substrate provided by at least one embodiment of the present disclosure further comprises a base substrate, the first scan driving circuit, the second scan driving circuit, and the organic insulation layer are on the base substrate, the display substrate further comprises a first power line on the base substrate and in the peripheral region, the first power line comprises a first portion extending in the first direction and a second portion extending in the second direction on the second side, in a direction perpendicular to the base substrate, the first groove at least partially overlaps with the first portion of the first power line, the organic insulation layer further comprises a blocking wall at an edge of the first portion of the first power line along the second direction, the first groove is disconnected at the blocking wall, and the blocking wall covers the edge of the first portion of the first power line along the second direction.

For example, the display substrate provided by at least one embodiment of the present disclosure further comprises a second power line on the base substrate and in the peripheral region, in a direction perpendicular to the base substrate, the first groove does not overlap with the second power line.

For example, in the display substrate provided by at least one embodiment of the present disclosure, the second power line is on a side of the first power line away from the display region, the second power line comprises a first portion extending in the first direction and a second portion extending in the second direction on the second side, at least part of the first groove is between the second portion of the first power line and the second portion of the second power line.

For example, in the display substrate provided by at least one embodiment of the present disclosure, the first portion of the first power line and the first portion of the second power line are electrically connected to the binding region.

For example, in the display substrate provided by at least one embodiment of the present disclosure, the display region comprises a pixel array, the pixel array comprises a plurality of sub-pixels arranged in an array, each of the plurality of sub-pixels comprises a row scan signal terminal, a light emitting control signal terminal, and a data signal terminal, which are configured to receive a row scan signal, a light emitting control signal, and a data signal, respectively, and is configured to work according to the row scan signal, the light emitting control signal, and the data signal, the first scan driving circuit is a row scan driving circuit configured to provide the row scan signal, and the second scan driving circuit is a light emitting scan driving circuit configured to provide the light emitting control signal.

For example, in the display substrate provided by at least one embodiment of the present disclosure, the peripheral region further comprises an electrostatic discharge circuit electrically connected to one end of the first scan driving circuit and one end of the second scan driving circuit, respectively, an orthographic projection of the first groove on a plane where the electrostatic discharge circuit is located passes through the electrostatic discharge circuit, and in the direction perpendicular to the base substrate, the first groove does not expose the electrostatic discharge circuit.

For example, in the display substrate provided by at least one embodiment of the present disclosure, a first width of a portion of the first groove on the first side is smaller than a second width of a portion of the first groove on the second side, and the second width is 2-3 times the first width.

For example, in the display substrate provided by at least one embodiment of the present disclosure, the display region comprises a pixel array, the pixel array comprises a plurality of sub-pixels arranged in an array, each of the plurality of sub-pixels comprises a light emitting device and a pixel drive circuit, the pixel drive circuit is on the base substrate, and the display region further comprises a planarization layer on a side of the pixel drive circuit away from the base substrate, and the light emitting device is on a side of the planarization layer away from the base substrate, and the organic insulation layer and the planarization layer are arranged in a same layer.

For example, in the display substrate provided by at least one embodiment of the present disclosure, the first scan driving circuit, the second scan driving circuit, and the electrostatic discharge circuit are arranged in a same layer as the pixel drive circuit.

For example, in the display substrate provided by at least one embodiment of the present disclosure, the peripheral region further comprises a first barrier wall on a side of the second scan driving circuit away from the display region, the organic insulation layer further comprises a second groove between the second scan driving circuit and the first barrier wall, and the second groove surrounds four sides of the display region.

For example, in the display substrate provided by at least one embodiment of the present disclosure, the peripheral region further comprises a second barrier wall on a side of the first barrier wall away from the display region, the organic insulation layer further comprises a third groove between the first barrier wall and the second barrier wall, and the third groove surrounds the four sides of the display region.

For example, in the display substrate provided by at least one embodiment of the present disclosure, the organic insulation layer further comprises a fourth groove on a side of the second barrier wall away from the display region, and the fourth groove surrounds the four sides of the display region.

For example, in the display substrate provided by at least one embodiment of the present disclosure, the display region further comprises a pixel defining layer on a side of the planarization layer away from the pixel drive circuit and a spacer layer on a side of the pixel defining layer away from the planarization layer, the first barrier wall is in a same layer as at least part of a group consisting of the organic insulation layer, the pixel defining layer, and the spacer layer.

For example, in the display substrate provided by at least one embodiment of the present disclosure, the second barrier wall is in a same layer as at least part of the group consisting of the organic insulation layer, the pixel defining layer, and the spacer layer, and in the direction perpendicular to the display substrate, a height of the second barrier wall is higher than a height of the first barrier wall.

For example, in the display substrate provided by at least one embodiment of the present disclosure, the pixel drive circuit comprises a thin film transistor, and the thin film transistor includes a gate electrode and source-drain electrodes, the first power line and the second power line are in a same layer as the source-drain electrodes.

At least one embodiment of the present disclosure further provides a display device, the display device comprises the display substrate provided by the embodiments of the present disclosure.

At least one embodiment of the present disclosure further provides a manufacture method of a display substrate, the manufacture method comprises forming a display region and a peripheral region at a periphery of the display region, in which a first scan driving circuit and a second scan driving circuit are formed on a first side of the display region and in the peripheral region, the first scan driving circuit is formed on a side of the second scan driving circuit close to the display region, and a binding region is formed on a second side, which is adjacent to the first side, of the display region and in the peripheral region, the manufacture method further comprises: forming an organic insulation layer in the peripheral region, in which the organic insulation layer at least partially covers the first scan driving circuit and at least partially covers the second scan driving circuit, and comprises a first groove that is in a strip shape and extends substantially along a first direction to expose a portion between the first scan driving circuit and the second scan driving circuit, the first groove extends from the first side to the second side and extends substantially along a second direction on the second side, and the second direction intersects the first direction.

For example, the manufacture method of the display substrate provided by at least one embodiment of the present disclosure further comprises providing a base substrate, in which the first scan driving circuit, the second scan driving circuit, and the organic insulation layer are formed on the base substrate, and forming a first power line on the base substrate and in the peripheral region, in which the first power line comprises a first portion extending along the first direction and a second portion extending along the second direction on the second side, in a direction perpendicular to the base substrate, the first groove at least partially overlaps with the first portion of the first power wiring line, the organic insulation layer further comprises a blocking wall at an edge of the first portion of the first power line along the second direction, the first groove is disconnected at the blocking wall, and the blocking wall covers the edge of the first portion of the first power line along the second direction.

For example, the manufacture method of the display substrate provided by at least one embodiment of the present disclosure further comprises forming a second power line on the base substrate and in the peripheral region, in a direction perpendicular to the base substrate, the first groove does not overlap with the second power line.

BRIEF DESCRIPTION OF THE DRAWINGS

In order to demonstrate clearly technical solutions of the embodiments of the present disclosure, the accompanying drawings in relevant embodiments of the present disclosure will be introduced briefly. It is apparent that the drawings may only relate to some embodiments of the disclosure and not intended to limit the present disclosure.

DETAILED DESCRIPTION

Figure 1:
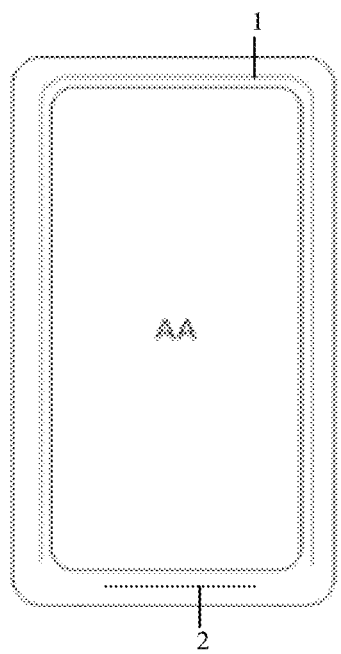
FIG. 1 is a schematic plane diagram of a display substrate.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment (s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "left," "right" and the like are only used to indicate relative position relationship, and when the position of the object which is described is changed, the relative position relationship may be changed accordingly.

A display region of an OLED display substrate includes a drive circuit layer, a light emitting device, an encapsulation layer covering the light emitting device, and other structures, the encapsulation layer protects the drive circuit layer and the light emitting device to prevent impurities in the external environment from entering the display region and from destroying the structures of the drive circuit layer and the light emitting device. The inventor of the present disclosure noticed that because there are usually one or more insulation layers in the drive circuit layer and between the drive circuit layer and the display device, at least some of these insulation layers have hydrophilic properties. When the encapsulation layer is damaged, such as having cracks, impurities such as external water and oxygen will enter the display region along the above-mentioned insulation layers, thereby destroying the structures of the drive circuit layer and the light emitting device, and therefore an ineffective region that cannot display normally is formed in the display region, and the ineffective region will continue to expand.

In some embodiments, a groove may be formed in the above-mentioned insulation layer to block an extension path of impurities, such as water and oxygen, into the display region.

For example, FIG. 1 shows a schematic plane view of a display device. In the display device, a groove 1 is provided in an insulation layer in a peripheral region outside a display region AA, the groove 1 surrounds the upper side, the left side, and the right side of the display region AA to block the extension paths of impurities, such as water and oxygen, on the upper side, the left side, and the right side of the display region AA. In some embodiments, the insulation layer in the peripheral region further has a groove 2, the groove 2 is located on the lower side of the display region AA to block the extension path of impurities, such as water and oxygen, on the lower side of the display region AA. However, because a large region where no groove is provided is between the groove 1 and the groove 2, this region may also form diffusion paths for impurities such as water and oxygen, so that the display region AA has a relatively high risk of failure.

At least one embodiment of the present disclosure provides a display substrate and a manufacture method thereof, and a display device. The display substrate comprises a display region and a peripheral region at a periphery of the display region, the peripheral region comprises a first scan driving circuit and a second scan driving circuit that are on a first side of the display region, the first scan driving circuit is on a side of the second scan driving circuit close to the display region, the peripheral region further comprises a binding region on a second side, which is adjacent to the first side, of the display region, the peripheral region comprises an organic insulation layer, the organic insulation layer at least partially covers the first scan driving circuit and at least partially covers the second scan driving circuit, and comprises a first groove that is in a strip shape and extends substantially along a first direction to expose a portion between the first scan driving circuit and the second scan driving circuit, and the first groove also extends from the first side to the second side and extends substantially along a second direction on the second side, and the second direction intersects the first direction. The organic insulation layer in the peripheral region of the display substrate includes the first groove substantially surrounding four sides of the display region, the first groove can effectively block the paths of impurities such as water and oxygen into the display region, thereby protecting the display region; in addition, at least part of the first groove is located between the first scan driving circuit and the second scan driving circuit in the peripheral region, so that the first groove can protect the display region at a position closer to the display region.

Hereinafter, a detailed and non-restrictive introduction of the display substrate, the manufacture method thereof, and the display device provided by the embodiments of the present disclosure is provided through several specific embodiments.

Figure 2:
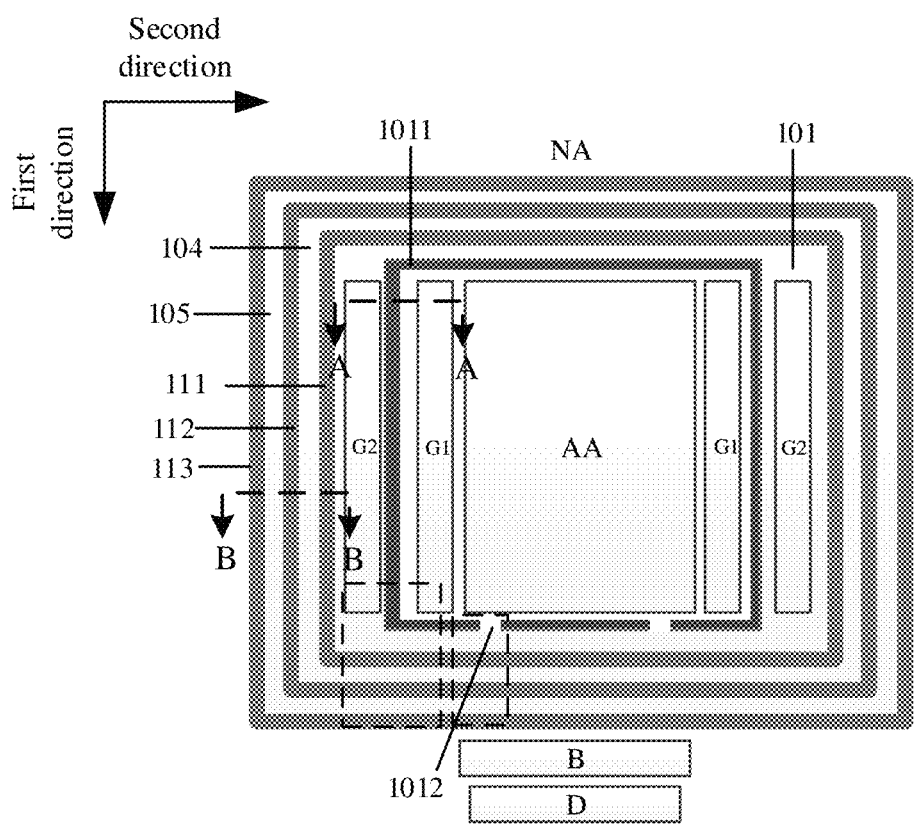
FIG. 2 is a schematic plane diagram of a part of a display substrate provided by at least one embodiment of the present disclosure.

FIG. 2 is a schematic plane diagram of a display substrate provided by at least one embodiment of the present disclosure, as shown in FIG. 2, the display substrate includes a display region AA and a peripheral region NA located at a periphery of the display region. The peripheral region NA includes a first scan driving circuit G1 and a second scan driving circuit G2 that are located on a first side (for example, a left side in the figure) of the display region AA, the first scan driving circuit G1 and the second scan driving circuit G2 are separated by a certain distance, the first scan driving circuit G1 is located on a side of the second scan driving circuit G2 close to the display region AA, the peripheral region NA further includes a binding region B located on a second side (for example, a lower side in the figure), which is adjacent to the first side, of the display region AA, the peripheral region NA includes an organic insulation layer 101, the organic insulation layer 101 at least partially covers the first scan driving circuit G1 and at least partially covers the second scan driving circuit G2, thereby protecting the circuit structures of the first scan driving circuit G1 and the second scan driving circuit G2. For example, the organic insulation layer 101 includes a first groove 1011 that is in a strip shape and extends substantially along a first direction (a vertical direction in the figure) to expose a portion between the first scan driving circuit G1 and the second scan driving circuit G2, that is, a portion, which is located between the first scan driving circuit G1 and the second scan driving circuit G2, of the organic insulating layer 101 is removed to form the first groove 1011. For example, the first groove 1011 also extends from the first side to the second side, and extends substantially along a second direction on the second side, and the second direction intersects the first direction.

For example, the first scan driving circuit G1 and the second scan driving circuit G2 are arranged along the first side, for example, an extension length of the first scan driving circuit G1 and an extension length of the second scan driving circuit G2 are approximately equal to a length of the display region AA on the first side. The first groove 1011 is formed in a long strip shape and extends substantially along the first direction and between the first scan driving circuit G1 and the second scan driving circuit G2.

For example, in some embodiments, the second direction is perpendicular to the first direction. For example, in the embodiment shown in FIG. 1, the first groove 1011 extends along a left edge of the display region AA on the first side. After the first groove 1011 extends from the first side to the second side, the first groove 1011 continues to extend along a lower edge of the display region AA on the second side. Thus, the first groove 1011 can achieve the technical effect of effectively blocking impurities such as water and oxygen from entering the display region AA around the display region AA.

For example, in some embodiments, the display substrate includes a base substrate, and structures such as the first scan driving circuit G1, the second scan driving circuit G2, and the organic insulation layer 101 are disposed on the base substrate.

Figure 3:
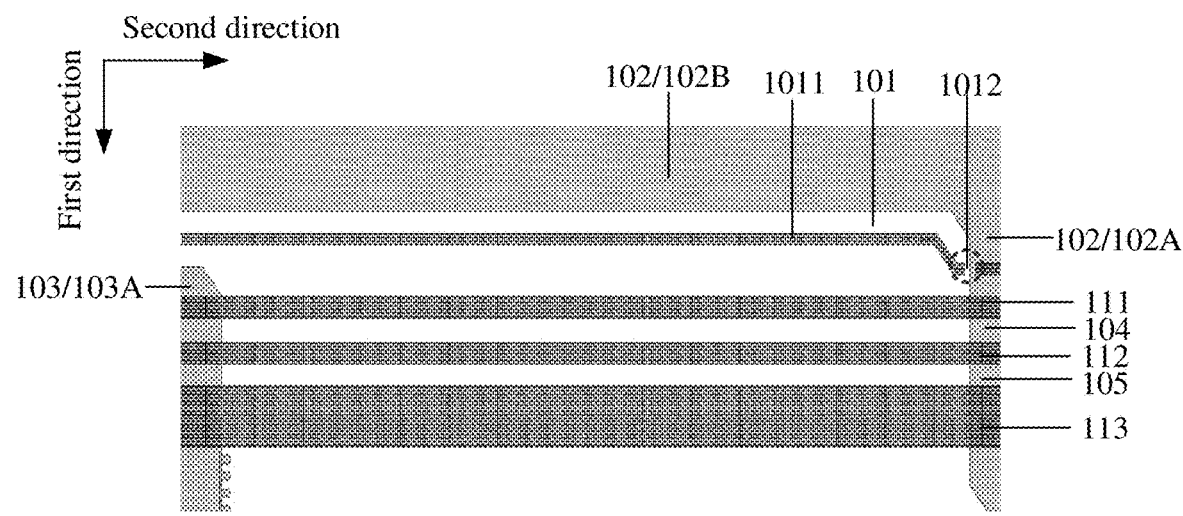
FIG. 3 is a schematic plane diagram of another part of a display substrate provided by at least one embodiment of the present disclosure.

For example, FIG. 3 is an enlarged schematic diagram of a dashed box on the right side of FIG. 2, as shown in FIG. 3, the display substrate further includes a first power line 102 on the base substrate and located in the peripheral region NA, and the first power line includes a first portion 102A extending in a first direction and a second portion 102B extending in a second direction on the second side. In a direction perpendicular to the base substrate, the first groove 1011 at least partially overlaps with the first portion 102A of the first power wiring line. For example, the organic insulation layer 101 further includes a blocking wall 1012 located at an edge of the first portion 102A of the first power line along the second direction, and the first groove 1011 is disconnected at the blocking wall 1012, that is, the portion of the organic insulation layer 101 located at the edge of the first portion 102A of the first power line along the second direction is not removed, and the material of the organic insulation layer 101 is retained, thereby forming the blocking wall 1012 that cuts off the first groove 1011, in this case, the blocking wall 1012 covers the edge of the first portion 102A of the first power line along the second direction. Therefore, the blocking wall 1012 protects the edge of the first portion 102A of the first power line along the second direction, and can prevent the material of the first power line 102 at the edge from being damaged during the manufacture process of the display substrate, such as from being corroded by an etching solution.

For example, in some embodiments, as shown in FIG. 3, the display substrate further includes a second power line 103 on the base substrate and located in the peripheral region NA. In a direction perpendicular to the base substrate, the first groove 1011 and the second power line 103 do not overlap with each other. Therefore, the first groove 1011 does not expose the second power line 103, and the organic insulation layer 101 covers the second power line 103 at least at the edge of the second power line 103, to protect the second power line 103 and prevent the material of the second power line 103 from being damaged during the manufacture process of the display substrate, for example, from being corroded by an etching solution.

For example, in some embodiments, the first power line 102 is a wiring line VDD for providing a high-level power signal, and the second power line 103 is a wiring line VSS for providing a low-level power signal.

Figure 4A:
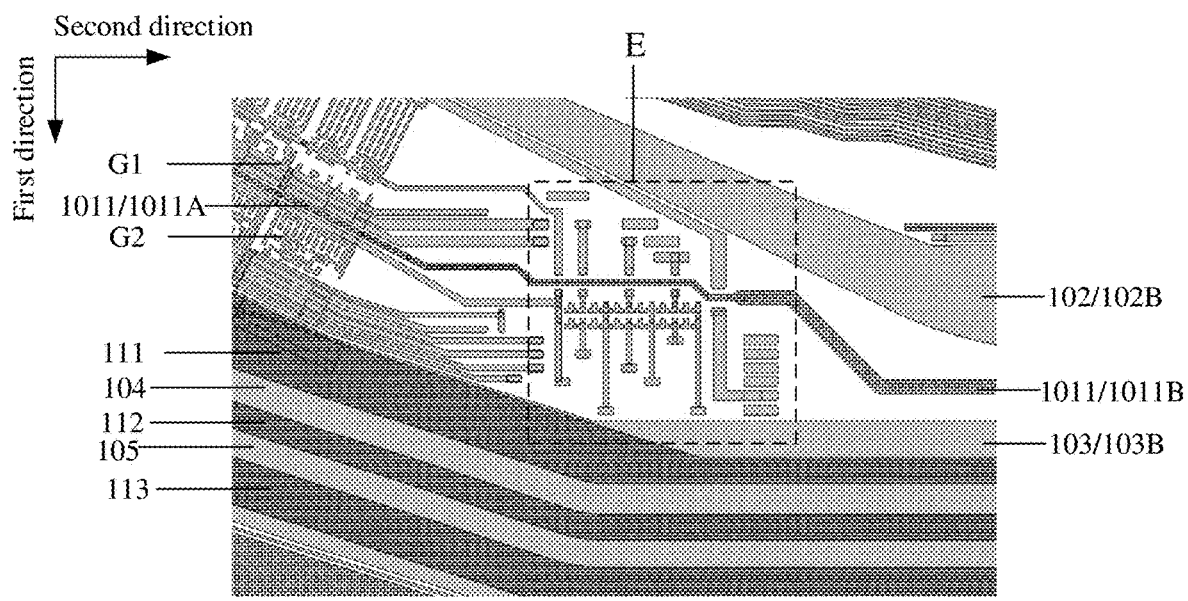
FIG. 4A is a schematic plane diagram of still another part of a display substrate provided by at least one embodiment of the present disclosure.

For example, FIG. 4A is an enlarged schematic diagram of a dashed box on the left side of FIG. 2. As shown in FIGS. 3 and 4A, the second power line 103 is located on the side of the first power line 102 away from the display region AA. For example, the second power line 103 includes a first portion 103A extending in the first direction and a second portion 103B extending in the second direction on the second side, at least part of the first groove 1011, for example, the portion 1011B, is between the second portion 102B of the first power line and the second portion 103B of the second power line.

For example, in some embodiments, as shown in FIG. 2, the first portion 102A of the first power line and the first portion 103A of the second power line are electrically connected to the binding region B. For example, in FIG. 4A, a lower end of the first portion 102A of the first power line and a lower end of the first portion 103A of the second power line extend to the binding region B. For example, the binding region B includes a plurality of contact pads, and the lower end of the first portion 102A of the first power line and the lower end of the first portion 103A of the second power line are respectively electrically connected to (i.e., bound to) these contact pads, thereby binding the first power line 102 and the second power line 103 to the binding region B.

For example, in some embodiments, as shown in FIG. 2, the display substrate further includes a driving circuit D, such as a chip IC or a flexible circuit board FPC, located on the side of the binding region B away from the display region AA, the binding region B is electrically connected to the driving circuit D through a plurality of wiring lines, thereby electrically connecting the first power line 102 and the second power line 103 to the driving circuit D, and furthermore, the driving circuit D is used to provide electrical signals for the first power line 102 and the second power line 103. For example, the display substrate may be a flexible display substrate, and the driving circuit D may be arranged on a non-display side of the display substrate by bending, so as to reduce the area of the peripheral region on the display side of the display substrate, thereby reducing the frame of the display substrate to achieve a large-screen display substrate.

Figure 4B:
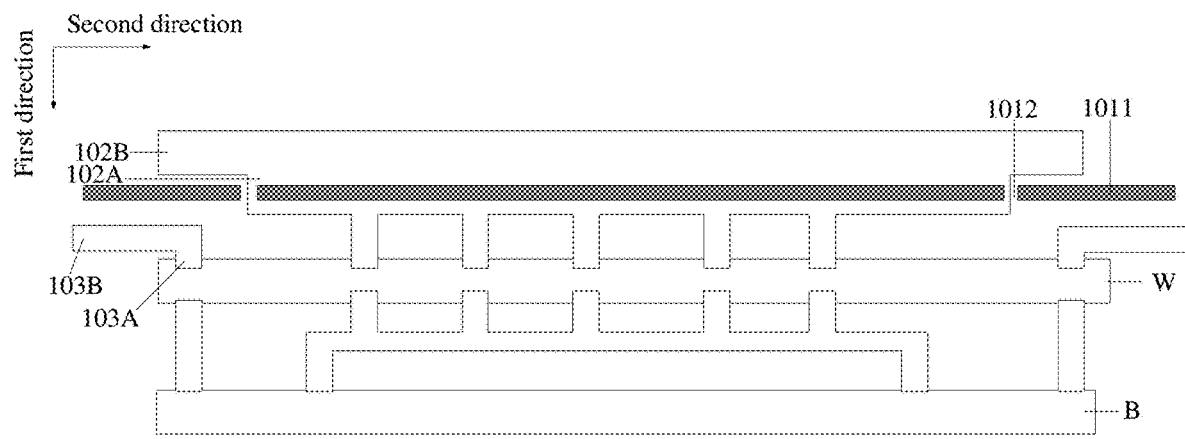
FIG. 4B is a schematic plane diagram of still another part of a display substrate provided by at least one embodiment of the present disclosure.

For example, FIG. 4B is a schematic plane diagram of a portion of the peripheral region NA located on the second side of the display region AA. In some embodiments, as shown in FIG. 4B, the first power line 102 is a wiring line layer continuously arranged on the second side of the display region AA, so that the first portion 102A of the first power line 102 has two edges respectively at a left end and a right end of the first portion 102A in the second direction. For example, the organic insulation layer 101 has blocking walls 1012 respectively at the two edges, and the first groove 1011 is disconnected at the two edges, so that the blocking walls 1012 protect the first power line 102 at the two edges.

For example, in some embodiments, the display substrate is a flexible display substrate, a bending region W is between the display region AA and the binding region B, and the driving circuit D is arranged on the non-display side of the display substrate by the bending of the bending region W. For example, the first portion 102A of the first power line 102 and the first portion 103A of the second power line are electrically connected to the binding region B through the bending region W. For example, the binding region B has a plurality of connection wiring lines, and the lower end of the first portion 102A of the first power line 102 and the lower end of the first portion 103A of the second power line are electrically connected to one end of the connection wiring lines in the bending region W, and the other end of the connection wiring lines in the bending region W is electrically connected to the binding region B, thereby electrically connecting the first portion 102A of the first power line 102 and the first portion 103A of the second power line to the binding region B.

For example, in some embodiments, the display region AA of the display substrate includes a pixel array, the pixel array comprises a plurality of sub-pixels arranged in an array, each of the plurality of sub-pixels includes a light emitting device and a pixel drive circuit, the pixel drive circuit includes a row scan signal terminal, a light emitting control signal terminal, and a data signal terminal, which are configured to receive a row scan signal, a light emitting control signal, and a data signal, respectively, and is configured to work according to the row scan signal, the light emitting control signal, and the data signal.

For example, the first scan driving circuit G1 is a row scan driving circuit configured to provide a row scan signal, and the second scan driving circuit G2 is a light emitting scan driving circuit configured to provide a light emitting control signal. For example, the first scan driving circuit G1 includes a plurality of first shift register units that are cascaded, each of the plurality of first shift register units includes a first scan signal output terminal, a plurality of first scan signal output terminals respectively correspond to a plurality of rows of sub-pixels in the display region AA, and are connected to the row scan signal terminals of the sub-pixels through corresponding wires, respectively; the second scan driving circuit G2 also includes a plurality of second shift register units that are cascaded, each of the plurality of second shift register units includes a second scan signal output terminal, and a plurality of second scan signal output terminals respectively correspond to a plurality of rows of sub-pixels in the display region AA, and are connected to the light emitting control signal terminals of the sub-pixels through corresponding wires, respectively.

The embodiments of the present disclosure have no limitation on the specific structures of the first scan driving circuit G1 and the second scan driving circuit G2. For example, the plurality of first shift register units included in the first scan driving circuit G1 or the plurality of second shift register units included in the second scan driving circuit G2 each may have a 4T1C structure, that is, at least include four transistors and one capacitor (FIG. 7 only shows one transistor as a reference) to implement signal input, signal output, register reset, and other functions, respectively; and may also include more transistors and/or capacitors, for example, adding sub-circuits for implementing functions such as pull-up node control, pull-down node control, noise reduction, etc., to achieve more stable input, output, and reset.

It should be noted that each of the first scan driving circuit and the second scan driving circuit described in the embodiments of the present disclosure includes structures such as thin film transistors, capacitors, and connection wiring lines between them, but does not include external signal wiring lines connected to the above-mentioned structures of the first scan driving circuit and the second scan driving circuit.

For example, in some embodiments, the wiring lines in the peripheral region NA are arranged axial-symmetrically. For example, as shown in FIG. 2, the display substrate further includes a first scan driving circuit G1 and a second scan driving circuit G2 located on a third side, which is opposite to the first side, of the display region AA, so as to jointly provide row scan signals and light emitting control signals for a plurality of sub-pixels. For example, taking a vertical center line of the display region AA in FIG. 2 as the axis of symmetry, the first scan driving circuit G1 as well as the second scan driving circuit G2 on the first side and the first scan driving circuit G1 as well as the second scan driving circuit G2 on the third side are arranged axial-symmetrically. For example, in some embodiments, taking the vertical center line of the display region AA in FIG. 2 as the axis of symmetry, the first power line 102 is arranged axial-symmetrically on the second side of the display region AA, in this case, the organic insulation layer 101 includes two blocking walls 1012 arranged axial-symmetrically, and the first groove 1011 is cut off at the two barrier walls 1012.

Figure 5:
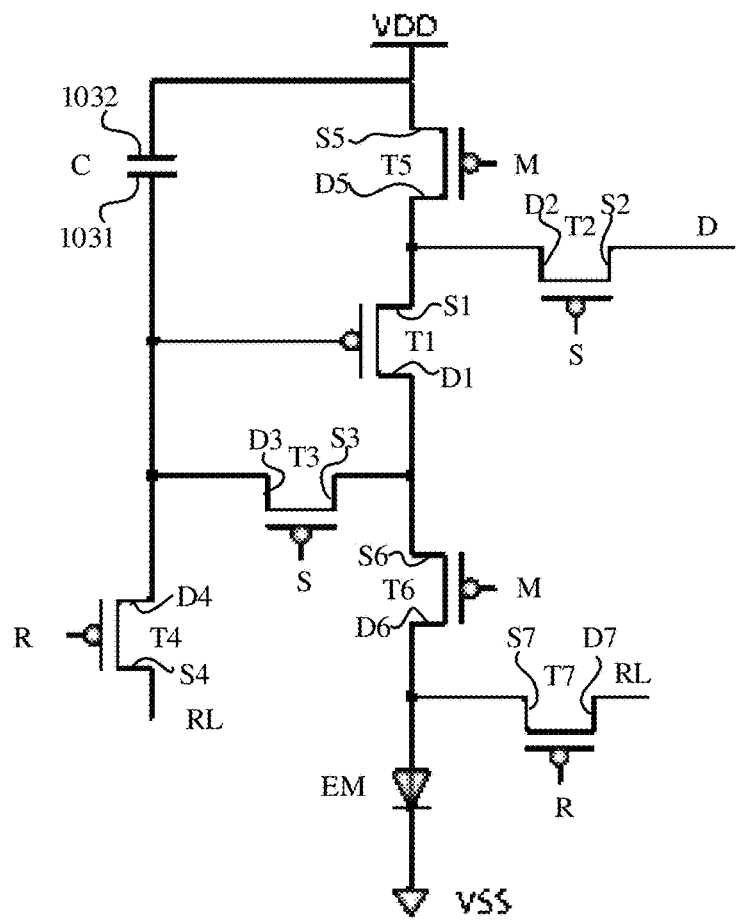
FIG. 5 is a circuit diagram of a pixel drive circuit of a display substrate provided by at least one embodiment of the present disclosure.

For example, FIG. 5 shows a circuit diagram of a pixel drive circuit. In some embodiments, as shown in FIG. 5, the pixel drive circuit may be a 7T1C pixel drive circuit, which includes a plurality of thin film transistors T1, T2, T3, T4, T5, T6, and T7, and a storage capacitor C, and has a row scan signal terminal S, a light emitting control signal terminal M, and a data signal terminal D, which are configured to receive the row scan signal, the light emitting control signal, and the data signal, respectively.

For example, a first gate electrode of the first thin film transistor T1 is electrically connected to a third drain electrode D3 of the third thin film transistor T3 and a fourth drain electrode D4 of the fourth thin film transistor T4. A first source electrode S1 of the first thin film transistor T1 is electrically connected to a second drain electrode D2 of the second thin film transistor T2 and a fifth drain electrode D5 of the fifth thin film transistor T5. A first drain electrode D1 of the first thin film transistor T1 is electrically connected to a third source electrode S3 of the third thin film transistor T3 and a sixth source electrode S6 of the sixth thin film transistor T6.

For example, a second gate electrode of the second thin film transistor T2 is configured as the row scan signal terminal S to receive the row scan signal, and a second source electrode S2 of the second thin film transistor T2 is configured as the data signal terminal electrically connected to the data line D to receive the data signal, and a second drain electrode D2 of the second thin film transistor T2 is electrically connected to the first source electrode S1 of the first thin film transistor T1.

For example, a third gate electrode of the third thin film transistor T3 is configured as the row scan signal terminal S to receive the row scan signal, a third source electrode S3 of the third thin film transistor T3 is electrically connected to the first drain electrode D1 of the first thin film transistor T1, and a third drain electrode D3 of the third thin film transistor T3 is electrically connected to the first gate electrode of the first thin film transistor T1.

For example, a fourth gate electrode G4 of the fourth thin film transistor T4 is configured as a reset signal terminal to receive a reset signal, a fourth source electrode S4 of the fourth thin film transistor T4 is configured to be electrically connected to an initialization line RL to receive an initialization signal, and a fourth drain electrode D4 of the fourth thin film transistor T4 is electrically connected to the first gate electrode of the first thin film transistor T1.

For example, a fifth gate electrode of the fifth thin film transistor T5 is configured as the light emitting control signal terminal M to receive the light emitting control signal, a fifth source electrode S5 of the fifth thin film transistor T5 is configured to be electrically connected to the first power line VDD to receive the first power signal, and a fifth drain electrode D5 of the fifth thin film transistor T5 is electrically connected to the first source electrode S1 of the first thin film transistor T1.

For example, a sixth gate electrode of the sixth thin film transistor T6 is configured as the light emitting control signal terminal M to receive the light emitting control signal, a sixth source electrode S6 of the sixth thin film transistor T6 is electrically connected to the first drain electrode D1 of the first thin film transistor T1, and a sixth drain electrode D6 of the sixth thin film transistor T6 is electrically connected to an anode layer of the light emitting device EM.

For example, a seventh gate electrode of the seventh thin film transistor T7 is configured as the reset signal terminal to receive the reset signal, a seventh source electrode S7 of the seventh thin film transistor T7 is electrically connected to the anode layer of the light emitting device EM, and a seventh drain electrode D7 of the seventh thin film transistor T7 is configured to be electrically connected to the initialization line RL to receive the initialization signal. For example, the seventh drain electrode D7 of the seventh thin film transistor T7 may be electrically connected to the initialization line RL by being connected to the fourth source electrode S4 of the fourth thin film transistor T4.

For example, the storage capacitor includes a first capacitor electrode plate 1031 and a second capacitor electrode plate 1032. The second capacitor electrode plate 1032 is electrically connected to the first power line VDD, the first capacitor electrode plate 1031 is electrically connected to the first gate electrode of the first thin film transistor T1 and the third drain electrode D3 of the third thin film transistor T3.

For example, a cathode layer of the light emitting device EM is electrically connected to the second power line VSS.

It should be noted that one of the first power line VDD and the second power line VSS is a power line providing a high voltage, and the other of the first power line VDD and the second power line VSS is a power line providing a low voltage. For example, the first power line VDD provides a first voltage that is constant, and the first voltage is a positive voltage; and the second power line VSS provides a second voltage that is constant, and the second voltage may be a negative voltage. For example, in some examples, the second voltage may also be a ground voltage. In addition, the above reset signal and the above initialization signal may be the same signal. For example, the first scan driving circuit G1 and the second scan driving circuit G2 are electrically connected to the row scan signal terminal S and the light emitting control signal M, respectively, to provide the row scan signal and the light emitting control signal, respectively.

For example, in some embodiments, as shown in FIG. 4A, the peripheral region NA of the display substrate further includes an electrostatic discharge circuit E electrically connected to one end of the first scan driving circuit G1 and one end of the second scan driving circuit G2, respectively, an orthographic projection of the first groove 1011 on a plane where the electrostatic discharge circuit E is located passes through the electrostatic discharge circuit, and in the direction perpendicular to the base substrate, the first groove 1011 does not expose the electrostatic discharge circuit E. For example, the electrostatic discharge circuit E includes a portion provided in the same layer as the source-drain electrodes of the thin film transistor T of the pixel drive circuit (described later), in the direction perpendicular to the base substrate, the first groove 1011 does not overlap with this portion. Thus, the organic insulation layer 101 also completely covers the electrostatic discharge circuit E to protect the circuit structure of the electrostatic discharge circuit E and prevent the circuit structure of the electrostatic discharge circuit E from being damaged during the manufacture process of the display substrate, such as being corroded by the etching solution. Because the electrical signal transmitted in the first scan driving circuit G1 and the electrical signal transmitted in the second scan driving circuit G2 may be quite different at different times, when the signals are switched between a high level and a low level, there may be a residual signal, which will cause signal crosstalk. The electrostatic discharge circuit arranged at one end of the first scan driving circuit G1 and one end of the second scan driving circuit G2 can process the electrical signals of the first scan driving circuit G1 and the second scan driving circuit G2, thereby eliminating such crosstalk.

For example, in some embodiments, as shown in FIG. 4A, a first width of the portion 1011A of the first groove 1011 on the first side is smaller than a second width of the portion 1011B of the first groove 1011 on the second side, and the second width is 2-3 times the first width. For example, in some examples, the first width of the portion 1011A of the first groove 1011 on the first side may be 9 μm~11 μm, such as 10 μm, etc., and the second width of the portion 1011B of the first groove 1011 on the second side may be 20 μm~30 μm, such as 25 μm.

It should be noted that the width of the first groove 1011 refers to the size of the first groove 1011 in a direction perpendicular to the extending direction of the first groove 1011. Because the circuit arrangement on the first side of the display region AA is relatively dense, the width of the portion 1011A of the first groove 1011 on the first side being narrow can reduce the area of the peripheral region NA on the first side, thereby achieving a narrow frame; and the circuit arrangement on the second side of the display region AA is relatively sparse, so the width of the portion 1011B of the first groove 1011 on the second side is increased to further improve the blocking effect of the first groove 1011 on impurities such as water and oxygen.

Figure 6:
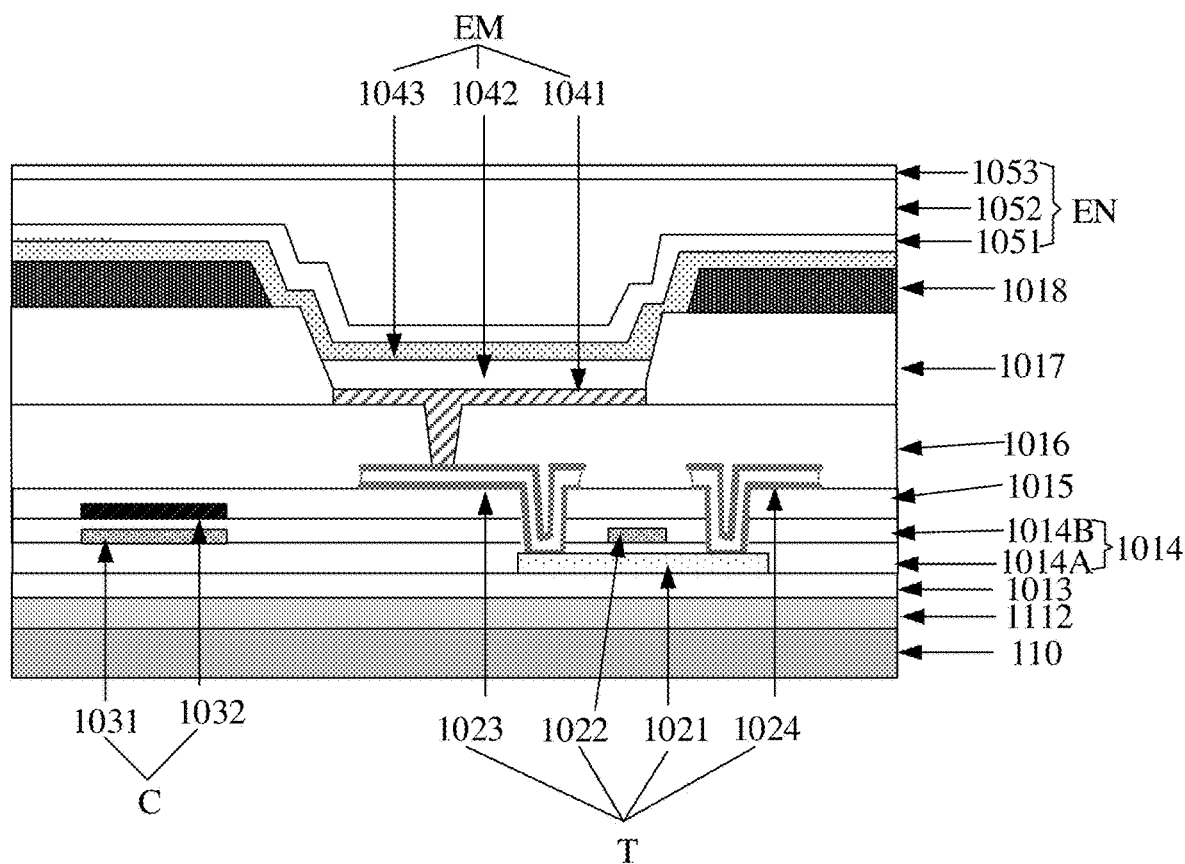
FIG. 6 is a schematic cross-sectional diagram of a display region of a display substrate provided by at least one embodiment of the present disclosure.

For example, FIG. 6 shows a schematic partial cross-sectional diagram of a sub-pixel in the display region AA. As shown in FIG. 6, each sub-pixel includes a light emitting device EM and a pixel drive circuit, the pixel drive circuit is disposed on the base substrate 110, and includes a thin film transistor T (for example, the above-mentioned sixth thin film transistor T6), a storage capacitor C, and other structures. For example, the display region AA further includes a planarization layer 1016 on the side of the pixel drive circuit away from the base substrate 110, and the light emitting device EM is located on the side of the planarization layer 1016 away from the base substrate 110. For example, the organic insulation layer 101 in the peripheral region NA and the planarization layer 1016 are arranged in the same layer.

It should be noted that, in the embodiments of the present disclosure, "being arranged in the same layer" means that two functional layers or structural layers are formed in the same layer and with the same material in the layer structure of the display substrate, that is, in the manufacture process, the two functional layers or structural layers can be formed of the same material layer, and the required patterns and structures can be formed through the same patterning process.

For example, in some embodiments, the first scan driving circuit G1, the second scan driving circuit G2, and the electrostatic discharge circuit E are arranged in the same layer as the pixel drive circuit.

For example, as shown in FIG. 6, the thin film transistor T of the pixel drive circuit includes an active layer 1021, a gate electrode 1022, a gate insulation layer 1014 (for example, including a first gate insulation layer 1014A and a second gate insulation layer 1014B), an interlayer insulation layer 1015, and source-drain electrodes (including a source electrode 1023 and a drain electrode 1024), which are sequentially disposed on the base substrate 110. The storage capacitor C of the pixel drive circuit includes a first capacitor electrode plate 1031 and a second capacitor electrode plate 1032. The light emitting device EM includes an anode layer 1041, a light emitting layer 1042, and a cathode layer 1043. The anode layer 1041 is connected to the source electrode 1023 of the thin film transistor through a via in the planarization layer 1016. For example, the first capacitor electrode plate 1031 and the gate electrode 1022 are arranged in the same layer, and the second capacitor electrode plate 1032 is between the gate insulation layer 1014 and the interlayer insulation layer 1015.

Figure 7:
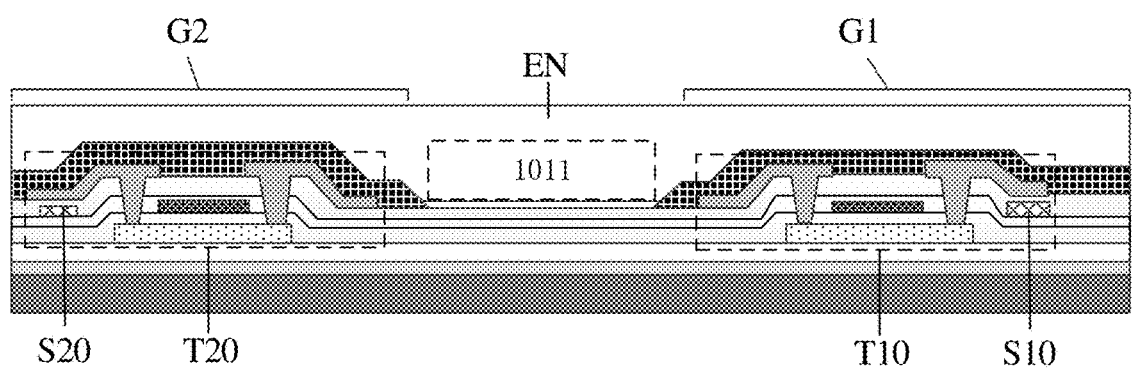
FIG. 7 is a schematic cross-sectional diagram taken along a line A-A in FIG. 2.

For example, FIG. 7 is a schematic cross-sectional diagram taken along a line A-A in FIG. 2, thereby showing the cross-sectional structure of the first scan driving circuit G1 and the cross-sectional structure of the second scan driving circuit G2. As shown in FIG. 7, the first scan driving circuit G1 includes structures such as a thin film transistor T10 and a wiring line S10, and the second scan driving circuit G2 includes structures such as a thin film transistor T20 and a wiring line S20. Each of the thin film transistors T10 and T20 includes structures such as an active layer, a gate electrode, a source electrode, and a drain electrode. For example, the thin film transistors T10 and T20 and the thin film transistor T of the pixel drive circuit are arranged in the same layer, that is, a corresponding layer in the thin film transistors T10 and T20 and a corresponding layer in the thin film transistor T of the pixel drive circuit are respectively arranged in the same layer. For example, the wiring line S10 and the wiring line S20 may be arranged in the same layer as the second capacitor electrode plate 1032. Therefore, the manufacture process of the display substrate can be simplified. For example, in some embodiments, as shown in FIG. 2, the peripheral region NA of the display substrate may further include a first barrier wall 104 located on the side of the second scan driving circuit G2 away from the display region AA, and the organic insulation layer 101 may further include a second groove 111 located between the second scan driving circuit G2 and the first barrier wall 104, that is, a portion, which is between the second scan driving circuit G2 and the first barrier wall 104, of the organic insulation layer 101 is removed to form the second groove 111. The second groove 111 surrounds the four sides of the display region AA. For example, the second groove 111 is in a closed ring shape, thereby completely surrounding the four sides of the display region AA. Therefore, the second groove 111 can achieve the technical effect of blocking impurities such as water and oxygen from entering the display region AA on the side of the first groove 1011 away from the display region AA.

For example, in some embodiments, as shown in FIG. 2, the peripheral region NA of the display substrate further includes a second barrier wall 105 located on the side of the first barrier wall 104 away from the display region AA, the organic insulation layer 101 further includes a third groove 112 located between the first barrier wall 104 and the second barrier wall 105, that is, a portion of the organic insulation layer 101 located between the first barrier wall 104 and the second barrier wall 105 is removed to form the third groove 112. The third groove 112 surrounds the four sides of the display region AA. For example, the third groove 112 is in a closed ring shape, thereby completely surrounding the four sides of the display region AA. In this way, the third groove 112 together with the first groove 1011 and the second groove 111 can implement multiple blocking effects to prevent impurities such as water and oxygen from entering the display region AA.

Figure 8:
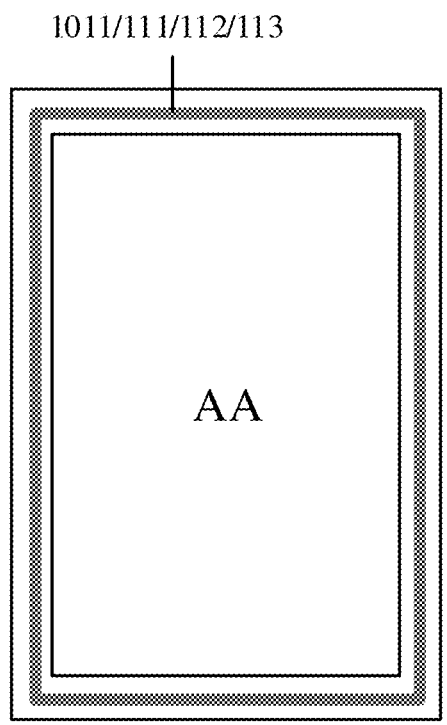
FIG. 8 is a schematic plane diagram of a display substrate provided by at least one embodiment of the present disclosure.

For example, in some embodiments, as shown in FIG. 2, the organic insulation layer 101 further includes a fourth groove 113 located on the side of the second barrier wall 105 away from the display region AA, that is, a portion of the organic insulation layer 101 located on the side of the second barrier wall 105 away from the display region AA is removed to form the fourth groove 113. The fourth groove 113 surrounds the four sides of the display region AA. For example, the fourth groove 113 is in a closed ring shape, so as to completely surround the four sides of the display region AA. Therefore, as shown in FIG. 8, the fourth groove 113, together with the first groove 1011, the second groove 111, and the third groove 112, can achieve multiple blocking effects at the four sides of the display region AA, to prevent impurities such as water and oxygen from entering the display region AA, thereby effectively protecting the internal structures of the display region AA.

For example, in some embodiments, as shown in FIG. 6, the display region AA further includes a pixel defining layer 1017 (used to define a plurality of sub-pixels) located on the side of the planarization layer 1016 away from the pixel drive circuit, and a spacer layer 1018 on the side of the pixel defining layer 1017 away from the planarization layer 1016. For example, the first barrier wall 104 is disposed in the same layer as at least part of a group consisting of the organic insulation layer 1016, the pixel defining layer 1017, and the spacer layer 1018.

For example, in some embodiments, the second barrier wall 105 is disposed in the same layer as at least part of the group consisting of the organic insulation layer 1016, the pixel defining layer 1017, and the spacer layer 1018, and in the direction perpendicular to the display substrate 110, the height of the second barrier wall 105 is higher than the height of the first barrier wall 104.

Figure 9:
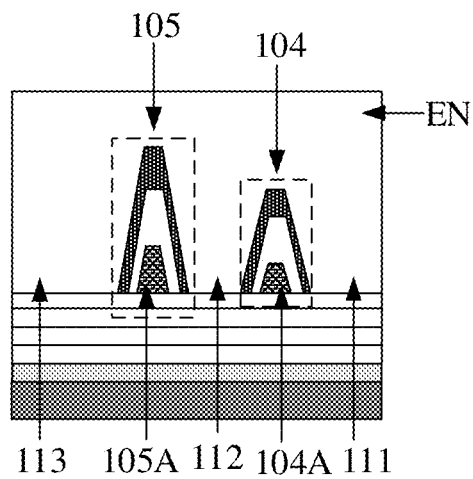
FIG. 9 is a schematic cross-sectional diagram taken along a line B-B in FIG. 2.

For example, FIG. 9 is a schematic cross-sectional diagram along a line B-B in FIG. 2, thereby showing the cross-sectional structure of the first barrier wall 104 and the cross-sectional structure of the second barrier wall 105. As shown in FIG. 9, in an example, the first barrier wall 104 includes three sub-layers, and the three sub-layers are arranged in the same layer as the organic insulation layer 1016, the pixel defining layer 1017, and the spacer layer 1018, respectively; the second barrier wall 105 also includes three sub-layers, and the three sub-layers are arranged in the same layer as the organic insulation layer 1016, the pixel defining layer 1017, and the spacer layer 1018, respectively. For example, the height of the first sub-layer 104A of the first barrier wall 104 is smaller than the height of the first sub-layer 105A of the second barrier wall 105, so the overall height of the first barrier wall 104 is smaller than the overall height of the second barrier wall 105. For example, the first sub-layer 104A of the first barrier wall 104 and the first sub-layer 105A of the second barrier wall 105 are both arranged in the same layer as the organic insulation layer 101, however, the first sub-layer 104A of the first barrier wall 104 is thinned during the manufacture process, so that the height of the first sub-layer 104A of the first barrier wall 104 is smaller than the height of the first sub-layer 105A of the second barrier wall 105. For example, in some examples, the height of the first barrier wall 104 is 0.8 μm~1 μm, such as 0.9 μm, and the height of the second barrier wall 105 is 1.2 μm~1.5 μm, such as 1.4 μm. Therefore, the first barrier wall 104 and the second barrier wall 105 form barrier walls with different heights in the peripheral region NA, which can extend the path of impurities such as water and oxygen entering the display region AA, thereby achieving the effect of protecting the display region AA.

For example, in other embodiments, the first barrier wall 104 may also be arranged in the same layer as the pixel defining layer 1017 and the spacer layer 1018, and the second barrier wall 105 may be arranged in the same layer as the organic insulation layer 1016, the pixel defining layer 1017, and the spacer layer 1018, so that the overall height of the first barrier wall 104 is smaller than the overall height of the second barrier wall 105; or, the first barrier wall 104 is arranged in the same layer as the organic insulation layer 1016 and the pixel defining layer 1017, and the second barrier wall 105 is arranged in the same layer as the organic insulation layer 1016, the pixel defining layer 1017, and the spacer layer 1018, so that the overall height of the first barrier wall 104 is smaller than the overall height of the second barrier wall 105. The embodiments of the present disclosure do not limit the specific arrangement of the first barrier wall 104 and the second barrier wall 105.

For example, in some embodiments, the first power line 102 and the second power line 103 are arranged in the same layer as the source electrode and the drain electrode of the thin film transistor T, thereby simplifying the manufacture process of the display substrate. For example, the first power line 102, the second power line 103, and the source electrode and the drain electrode of the thin film transistor T may be made of metal materials such as titanium, aluminum, copper, or molybdenum, or alloy materials. For example, the first power line 102, the second power line 103, and the source electrode and the drain electrode of the thin film transistor T may have a single-layer or multi-layer metal structure, such as a three-layer metal structure, such as titanium/aluminum/titanium, molybdenum/aluminum/molybdenum, titanium/copper/titanium, or molybdenum/copper/molybdenum, or other three-layer metal structures.

Because a middle layer, such as the aluminum layer, in the above three-layer structure is more active, if the edge portion of the first power line 102 and the edge portion of the second power line 103 are exposed, the etching solution used in the subsequent manufacture process of the display substrate, such as the etching solution used to etch to form the anode layer 1041 of the light emitting device EM, may etch the first power line 102 and the second power line 103, thereby damaging the structure of the first power line 102 and the structure of the second power line 103. In the embodiments of the present disclosure, the organic insulation layer 101 in the peripheral region NA covers at least the edge of the first power line 102 and the edge of the second power line 103, thereby protecting the structure of the first power line 102 and the structure of the second power line 103.

Figure 10A:
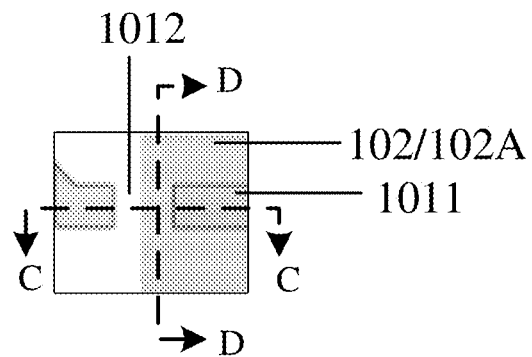
FIG. 10A is an enlarged schematic diagram of a dashed circle part in FIG. 3.
Figure 10B:
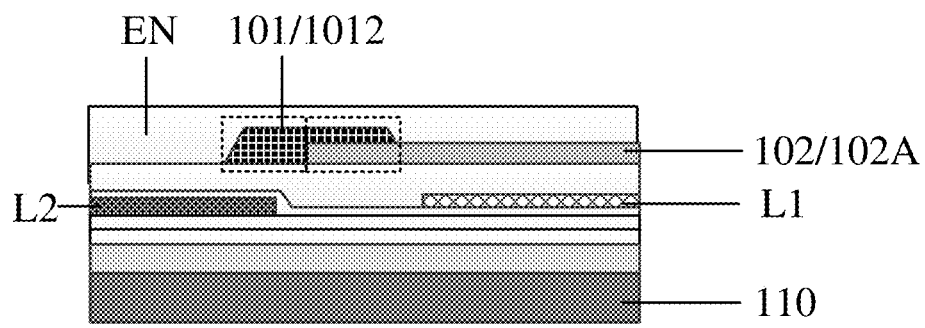
FIG. 10B is a schematic cross-sectional diagram taken along a line C-C in FIG. 10A.

For example, FIG. 10A shows a structure within a dashed circle in FIG. 3, and FIG. 10B is a schematic cross-sectional diagram along a line C-C in FIG. 10A. As shown in FIG. 10B, the blocking wall 1012 of the organic insulation layer 101 covers the edge (i.e., the left edge in the figure) of the first portion 102A of the first power line 102 along the second direction. Therefore, when the first power line 102 has a three-layer metal structure, the middle layer that is the more active metal layer will not be exposed, thus avoiding the risk of being etched.

For example, in some embodiments, as shown in FIG. 10B, the length of the blocking wall 1012 in the extending direction of the first groove 1011 (the horizontal direction in the figure) is 25 μm-35 μm, such as 30 μm, and the length of the portion of the first power line 102 (that is, the portion of the first power wiring line 102 located in the dashed frame on the right side of the figure) that is covered by the blocking wall 1012 is about 10 μm-20 μm, such as 15 μm, the length of the portion of the first power line 102 (that is, the portion of the first power line 102 located in the dashed frame on the left side of the figure) that is not covered by the blocking wall 1012 is about 10 μm-20 μm, for example, 15 μm.

Figure 10C:
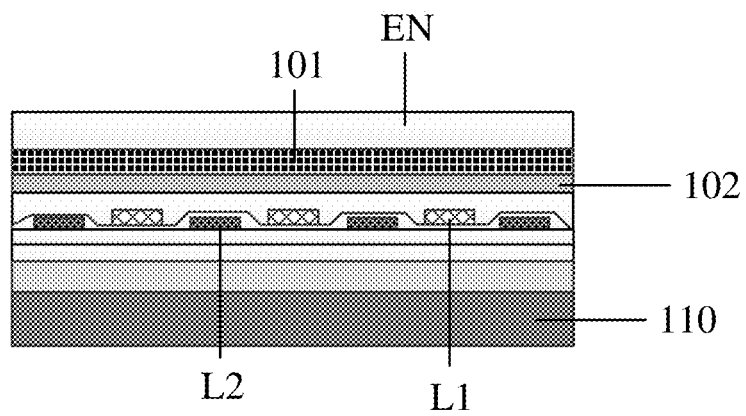
FIG. 10C is a schematic cross-sectional diagram taken along a line D-D in FIG. 10A.

For example, FIG. 10C is a schematic cross-sectional diagram taken along a line D-D in FIG. 10A. As shown in FIG. 10B and FIG. 10C, the display substrate further includes a wiring line L1 and a wiring line L2 on the side of the first power line 102 close to the base substrate 110. For example, the wiring line L1 and the wiring line L2 are electrically connected to the first scan driving circuit G1 and the second scan driving circuit G2, respectively, for providing electrical signals to the first scan driving circuit G1 and the second scan driving circuit G2, respectively. For example, the wiring line L1 is arranged in the same layer as the second capacitor electrode plate 1032 of the storage capacitor C, and the wiring line L2 is arranged in the same layer as the gate electrode 1022 of the thin film transistor T and the first capacitor electrode plate 1031 of the storage capacitor C. This simplifies the manufacture process of the display substrate.

For example, in some embodiments, as shown in FIG. 6, the display substrate may further include a barrier layer 1112 and a buffer layer 1013 disposed on the base substrate 110, the barrier layer 1012 can prevent impurities such as water and oxygen from penetrating from the base substrate 110 into the functional structures such as the thin film transistor T, and the buffer layer 1013 can provide a flat surface to facilitate the arrangement of other functional layers of the display substrate. The barrier layer 1112 and the buffer layer 1013 can collectively protect other functional structures on the base substrate 110.

For example, as shown in FIG. 6, the display substrate may further include an encapsulation layer EN. The encapsulation layer EN includes a first inorganic encapsulation layer 1051, a first organic encapsulation layer 1052, and a second inorganic encapsulation layer 1053 that are sequentially stacked on the base substrate 110. Therefore, the encapsulation layer EN can form a multilayer encapsulation on the display substrate to protect the display substrate.

For example, in some embodiments, the base substrate 110 may be a flexible substrate such as a polyimide (PI) flexible substrate. For example, the materials of the gate electrode 211, the first electrode plate 1031, and the second electrode plate 1032 include metal materials such as aluminum, titanium, cobalt, and copper, or alloy materials. The active layer 1021 may use materials such as polysilicon or metal oxide. The barrier layer 1112, the buffer layer 1013, the gate insulation layer 1014 (including first gate insulation layer 1014A and second gate insulation layer 1014B), the interlayer insulation layer 1015, and the first inorganic encapsulation layer 1051 and the second inorganic encapsulation layer 1053 of the encapsulation layer EN may be made of inorganic insulation materials such as silicon oxide, silicon nitride, or silicon oxynitride. For example, the planarization layer 1016, the organic insulation layer 101, the pixel defining layer 1017, the spacer layer 1018, and the first organic encapsulation layer 1052 of the encapsulation layer EN may be made of organic insulation materials such as polyimide or resin. The embodiments of the present disclosure do not limit the material of each functional layer, and the material of each functional layer is not limited to the above examples.

At least one embodiment of the present disclosure further provides a display device, the display device includes any display substrate provided by the embodiments of the present disclosure. The display device may be a product or component with a display function, such as a mobile phone, a tablet computer, a television, a monitor, a notebook computer, a digital camera, a navigator, and the like. The embodiments of the present disclosure do not limit the type of the display device.

At least one embodiment of the present disclosure further provides a manufacture method for manufacturing a display substrate, the manufacture method includes forming a display region and a peripheral region located at a periphery of the display region. Forming the peripheral region includes forming a first scan driving circuit and a second scan driving circuit on a first side of the display region in the peripheral region, the first scan driving circuit being formed on a side of the second scan driving circuit close to the display region, and forming a binding region on a second side, which is adjacent to the first side, of the display region in the peripheral region. The manufacture method further includes: forming an organic insulation layer in the peripheral region. The organic insulation layer at least partially covers the first scan driving circuit and at least partially covers the second scan driving circuit, and includes a first groove that is in a strip shape and extends substantially along a first direction to expose a portion between the first scan driving circuit and the second scan driving circuit, the first groove extends from the first side to the second side and extends substantially along a second direction on the second side, and the second direction intersects the first direction.

For example, in some embodiments, the manufacture method of the display substrate further includes: providing a base substrate, the first scan driving circuit, the second scan driving circuit, and the organic insulation layer being formed on the base substrate, and forming a first power line on the base substrate and in the peripheral region. The first power line includes a first portion extending along the first direction and a second portion extending along the second direction on the second side, in a direction perpendicular to the base substrate, the first groove at least partially overlaps with the first portion of the first power line, the organic insulation layer further includes a blocking wall at an edge of the first portion of the first power line along the second direction, the first groove is disconnected at the blocking wall, and the blocking wall covers the edge of the first portion of the first power line along the second direction.

For example, in some embodiments, the manufacture method of the display substrate further includes forming a second power line on the base substrate and in the peripheral region, in the direction perpendicular to the base substrate, the first groove does not overlap with the second power line.

For example, in some embodiments, referring to FIG. 6, the display region includes a pixel array, the pixel array includes a plurality of sub-pixels arranged in an array, and each of the plurality of sub-pixels includes a light emitting device and a pixel drive circuit, and the pixel drive circuit is disposed on the base substrate, a planarization layer is formed on a side of the pixel drive circuit away from the base substrate, and the light emitting device is formed on a side of the planarization layer away from the base substrate. For example, the organic insulation layer in the peripheral region and the planarization layer are formed in the same layer, for example, are made of the same material layer and formed by the same patterning process, so as to simplify the manufacture process of the display substrate.

For example, one patterning process includes procedures such as photoresist formation, exposure, development, and etching. The embodiments of the present disclosure do not specifically limit the formation method of each structural layer or functional layer.

For example, in some embodiments, the pixel drive circuit includes a thin film transistor, and the thin film transistor includes a gate electrode, a source electrode, a drain electrode, and other structures, and the first power line and the second power line are formed in the same layer as the source electrode and the drain electrode.

For example, in some embodiments, referring to FIG. 6 and FIG. 7, the first scan driving circuit, the second scan driving circuit, and the electrostatic discharge circuit are formed in the same layer as the pixel drive circuit. For example, the first scan driving circuit and the second scan driving circuit each includes thin film transistors, and a corresponding layer in the thin film transistor of the first scan driving circuit, a corresponding layer in the thin film transistor of the second scan driving circuit and a corresponding layer in the thin film transistor of the pixel drive circuit are formed in the same layer.

For example, in some embodiments, referring to FIG. 2, FIG. 6 and FIG. 9, forming the peripheral region further includes forming a first barrier wall on a side of the second scan driving circuit away from the display region, a second groove is formed between the second scan driving circuit and the first barrier wall, and formed in the organic insulation layer, and the second groove surrounds the four sides of the display region.

For example, forming the peripheral region further includes forming a second barrier wall on a side of the first barrier wall away from the display region, a third groove is formed between the first barrier wall and the second barrier wall, and formed in the organic insulation layer, and the third groove surrounds the four sides of the display region.

For example, a fourth groove is further formed on the side of the second barrier wall away from the display region, and formed in the organic insulation layer, and the fourth groove surrounds the four sides of the display region.

For example, forming the display region further includes forming a pixel defining layer on the side of the planarization layer away from the pixel drive circuit and forming a spacer layer on the side of the pixel defining layer away from the planarization layer, the first barrier wall is formed in the same layer as at least part of a group consisting of the organic insulation layer, the pixel defining layer, and the spacer layer. For example, the second barrier wall is formed in the same layer as at least part of the group consisting of the organic insulation layer, the pixel defining layer, and the spacer layer, and in the direction perpendicular to the display substrate, the height of the second barrier wall is higher than the height of the first barrier wall. For the specific forms of the first barrier wall and the second barrier wall, reference may be made to the above-mentioned embodiments, which will not be repeated here.

In the display substrate provided by the embodiments of the present disclosure or the display substrate obtained by the manufacture method provided by the embodiments of the present disclosure, the organic insulation layer included in the peripheral region of the display substrate includes a first groove substantially surrounding the four sides of the display region, the first groove can effectively block the path of impurities such as water and oxygen into the display region, thereby protecting the display region; in addition, at least part of the first groove is located between the first scan driving circuit and the second scan driving circuit in the peripheral region, so that the first groove can protect the display region at a position closer to the display region; moreover, the first groove does not expose the edge of the first power line and the edge of the second power line that are located under the organic insulation layer, and therefore the organic insulation layer can also effectively protect the first power line and the second power line. In addition, structures, such as the second groove, the third groove, the fourth groove, the first barrier wall, and the second barrier wall, are also formed in the peripheral region, and these structures together with the first groove can effectively prevent impurities such as water and oxygen from entering the display region, thereby protecting the display region and improving the reliability of the display substrate.

The following several statements should be noted:

(1) The accompanying drawings involve only the structure(s) in connection with the embodiment(s) of the present disclosure, and other structure(s) can be referred to common design(s).

(2) For clarity, in accompanying drawings for illustrating the embodiment(s) of the present disclosure, the thickness of a layer or a region may be enlarged or reduced, that is, the drawings are not drawn in an actual scale. It should understood that, in the case that a component such as a layer, film, region, substrate or the like is referred to be "on" or "under" another component, it may be directly on or under the another component or a component is interposed therebetween.

(3) In case of no conflict, embodiments of the present disclosure and the features in the embodiments may be mutually combined to obtain new embodiments.

The above descriptions are only specific embodiments of the present disclosure, but the protection scope of the present disclosure is not limited thereto, the protection scope of the present disclosure should be determined by the protection scope of the claims.

What is claimed is:

1. A display substrate, comprising a display region and a peripheral region at a periphery of the display region, wherein the peripheral region comprises a first scan driving circuit and a second scan driving circuit that are on a first side of the display region, the first scan driving circuit is on a side of the second scan driving circuit close to the display region, the peripheral region further comprises a binding region on a second side, which is adjacent to the first side, of the display region, and the binding region comprises a plurality of contact pads, and the plurality of contact pads are configured to be connected with power lines;

the peripheral region comprises an organic insulation layer, the organic insulation layer at least partially covers the first scan driving circuit and at least partially covers the second scan driving circuit, and comprises a first groove that is partially in a strip shape and extends substantially along a first direction to expose a portion between the first scan driving circuit and the second scan driving circuit, and the first groove also extends from the first side to the second side and extends substantially along a second direction on the second side, and the second direction is different from intersects the first direction;

the display substrate further comprises a base substrate, wherein the first scan driving circuit, the second scan driving circuit, and the organic insulation layer are on the base substrate, the display substrate further comprises a first power line of the power lines on the base substrate and in the peripheral region, and the first power line of the power lines comprises a first portion extending in the first direction and a second portion extending in the second direction on the second side, and in a direction perpendicular to the base substrate, the first groove at least partially overlaps with the first portion of the first power line of the power lines, the organic insulation layer further comprises a blocking wall at an edge of the first portion of the first power line of the power lines along the second direction, the first groove is disconnected at the blocking wall, and the blocking wall covers the edge of the first portion of the first power line of the power lines along the second direction.

2. The display substrate according to claim 1, further comprising a second power line of the power lines on the base substrate and in the peripheral region, wherein in a direction perpendicular to the base substrate, the first groove does not overlap with the second power line of the power lines.

3. The display substrate according to claim 2, wherein the second power line of the power lines is on a side of the first power line of the power lines away from the display region, the second power line of the power lines comprises a first portion extending in the first direction and a second portion extending in the second direction on the second side, at least part of the first groove is between the second portion of the first power line of the power lines and the second portion of the second power line of the power lines.

4. The display substrate according to claim 3, wherein the first portion of the first power line of the power lines and the first portion of the second power line of the power lines are electrically connected to the binding region.

5. The display substrate according to claim 1, wherein the display region comprises a pixel array, the pixel array comprises a plurality of sub-pixels arranged in an array, each of the plurality of sub-pixels comprises a row scan signal terminal, a light emitting control signal terminal, and a data signal terminal, which are configured to receive a row scan signal, a light emitting control signal, and a data signal, respectively, and is configured to work according to the row scan signal, the light emitting control signal, and the data signal, the first scan driving circuit is a row scan driving circuit configured to provide the row scan signal, and the second scan driving circuit is a light emitting scan driving circuit configured to provide the light emitting control signal.

6. The display substrate according to claim 2, wherein the peripheral region further comprises an electrostatic discharge circuit electrically connected to one end of the first scan driving circuit and one end of the second scan driving circuit, respectively, an orthographic projection of the first groove on a plane where the electrostatic discharge circuit is located passes through the electrostatic discharge circuit, and in the direction perpendicular to the base substrate, the first groove does not expose the electrostatic discharge circuit.

7. The display substrate according to claim 1, wherein a first width of a portion of the first groove on the first side is smaller than a second width of a portion of the first groove on the second side, and the second width is 2-3 times the first width.

8. The display substrate according to claim 6, wherein the display region comprises a pixel array, the pixel array comprises a plurality of sub-pixels arranged in an array, each of the plurality of sub-pixels comprises a light emitting device and a pixel drive circuit, the pixel drive circuit is on the base substrate, and the display region further comprises a planarization layer on a side of the pixel drive circuit away from the base substrate, and the light emitting device is on a side of the planarization layer away from the base substrate, and the organic insulation layer and the planarization layer are arranged in a same layer.

9. The display substrate according to claim 8, wherein the first scan driving circuit, the second scan driving circuit, and the electrostatic discharge circuit are arranged in a same layer as the pixel drive circuit.

10. The display substrate according to claim 8, wherein the peripheral region further comprises a first barrier wall on a side of the second scan driving circuit away from the display region, the organic insulation layer further comprises a second groove between the second scan driving circuit and the first barrier wall, and the second groove surrounds four sides of the display region.

11. The display substrate according to claim 10, wherein the peripheral region further comprises a second barrier wall on a side of the first barrier wall away from the display region, the organic insulation layer further comprises a third groove between the first barrier wall and the second barrier wall, and the third groove surrounds the four sides of the display region.

12. The display substrate according to claim 11, wherein the organic insulation layer further comprises a fourth groove on a side of the second barrier wall away from the display region, and the fourth groove surrounds the four sides of the display region.

13. The display substrate according to claim 11, wherein the display region further comprises a pixel defining layer on a side of the planarization layer away from the pixel drive circuit and a spacer layer on a side of the pixel defining layer away from the planarization layer, the first barrier wall is in a same layer as at least part of a group consisting of the organic insulation layer, the pixel defining layer, and the spacer layer.

14. The display substrate according to claim 13, wherein the second barrier wall is in a same layer as at least part of the group consisting of the organic insulation layer, the pixel defining layer, and the spacer layer, and in the direction perpendicular to the display substrate, a height of the second barrier wall is higher than a height of the first barrier wall.

15. The display substrate according to claim 8, wherein the pixel drive circuit comprises a thin film transistor, and the thin film transistor includes a gate electrode and source-drain electrodes, the first power line of the power lines and the second power line of the power lines are in a same layer as the source-drain electrodes.

16. A display device, comprising the display substrate according to claim 1.

17. A manufacture method of a display substrate, comprising forming a display region and a peripheral region at a periphery of the display region, wherein a first scan driving circuit and a second scan driving circuit are formed on a first side of the display region and in the peripheral region, the first scan driving circuit is formed on a side of the second scan driving circuit close to the display region, and a binding region is formed on a second side, which is adjacent to the first side, of the display region and in the peripheral region, the binding region comprises a plurality of contact pads, and the plurality of contact pads are configured to be connected with power lines;

the manufacture method further comprises: forming an organic insulation layer in the peripheral region, wherein the organic insulation layer at least partially covers the first scan driving circuit and at least partially covers the second scan driving circuit, and comprises a first groove that is partially in a strip shape and extends substantially along a first direction to expose a portion between the first scan driving circuit and the second scan driving circuit, the first groove extends from the first side to the second side and extends substantially along a second direction on the second side, and the second direction is different from intersects the first direction;

the manufacture method further comprises: providing a base substrate, wherein the first scan driving circuit, the second scan driving circuit, and the organic insulation layer are formed on the base substrate, and forming a first power line of the power lines on the base substrate and in the peripheral region, wherein the first power line of the power lines comprises a first portion extending along the first direction and a second portion extending along the second direction on the second side, and in a direction perpendicular to the base substrate, the first groove at least partially overlaps with the first portion of the first power line of the power lines, the organic insulation layer further comprises a blocking wall at an edge of the first portion of the first power line of the power lines along the second direction, the first groove is disconnected at the blocking wall, and the blocking wall covers the edge of the first portion of the first power line of the power lines along the second direction.

18. The manufacture method of the display substrate according to claim 17, further comprising forming a second power line of the power lines on the base substrate and in the peripheral region, wherein in a direction perpendicular to the base substrate, the first groove does not overlap with the second power line of the power lines.

* * * * *